United States Patent [19]

Ananthan et al.

[11] 4,313,105
[45] Jan. 26, 1982

[54] ENCODING SWITCHES

[75] Inventors: Manickam Ananthan, Romford; William J. Herring, Dagenham; Thomas D. Williams, Billericay; Peter B. Page, Harlow, all of England

[73] Assignee: Vickers Limited, London, England

[21] Appl. No.: 94,240

[22] Filed: Nov. 14, 1979

[30] Foreign Application Priority Data

Nov. 16, 1978 [GB] United Kingdom ............... 44793/78

[51] Int. Cl.³ ............................................. H01H 67/08
[52] U.S. Cl. ........................ 340/825.56; 200/11 DA; 371/52
[58] Field of Search ............................ 371/52; 178/22; 200/11 DA, 11 D, 43; 340/147 MD

[56] References Cited
U.S. PATENT DOCUMENTS

| | | | |
|---|---|---|---|
| 3,558,834 | 1/1971 | Zielke | 200/11 DA |
| 3,882,289 | 5/1975 | Walding et al. | 200/11 D |
| 4,090,173 | 5/1978 | Sibley | 371/52 |
| 4,134,103 | 1/1979 | Huxtable et al. | 371/52 |

Primary Examiner—Glen R. Swann, III
Attorney, Agent, or Firm—Shoemaker and Mattare, Ltd.

[57] ABSTRACT

Where switches are used for encoding decimal digits into binary words for use in processing devices in, for example, postal franking machines where security is essential, failure modes that produce normal codes not corresponding to the input decimal digits have to be detected. The switch described reduces the number of failure modes which the processor cannot recognize as errors in that it produces two 1-out-of-5 coded words for each decimal digit to enable a processing device to test whether each word in fact contains only one "1" (or "0") and then to combine the two words to produce a 2-out-of-5 word corresponding to the selected decimal digit. The switch comprises five contact elements A to E each comprising inner and outer arcuate portions 10, 11 concentric with common rings 13, 14. A rotatable part having ten positions 0 to 9 can be set in any one of those positions to select a decimal digit, and comprises connected contacts for bridging an inner arcuate portion 10 and ring 13 as well as, at a diametrically opposite point, an outer arcuate portion 11 and ring 14. When the rotatable part has been set, the two corresponding 1-out-of-5 codes are signalled by scanning in sequence the common rings and reading the five contact elements A to E.

12 Claims, 3 Drawing Figures

ENCODING SWITCHES

FIELD OF THE INVENTION

This invention relates to encoding switches to be set in positions respectively representing different decimal digits for controlling binary coded outputs representing the decimal digits.

In particular the invention is concerned with switches to be used in situations where security is of paramount importance. For example, it is essential that, where such switches are used in a postal franking meter, the sums recorded in the meter shall be the same as those printed on the letters or labels. Therefore, where there is a set of ten-position switches to be set to a franking value simultaneously with the setting of print wheels to that value, it is of primary importance to safeguard Post Office or user revenue by enabling a processing device to react to a failure of an encoding switch to produce a correct binary code.

DESCRIPTION OF THE PRIOR ART

The conventional 4-bit binary-coded-decimal (BCD) code used in many selector switches is unacceptable as there are many failure modes that can produce normal codes, e.g., open circuit on one contact may convert "9" into "1". Thus "9" would be franked but "1" charged to the Post Office.

A second alternative that is often used is to increase the complexity of the encoding switch to produce both the true and the complement of the binary code, e.g., 0100 and 1011 for decimal 4. A processing device can now recognise any failure except the highly unlikely one of a complementary fault in both parts of the switch. The disadvantage of this approach is the increased cost of the encoding switch and the doubling of the number of input connections to the processing device.

A third commonly used alternative is to use a 5-bit code where the fifth bit is chosen to create an odd number of "1's" in the code called "odd bit parity". This has the advantage of only one additional data input connection to the processing device. There are sixteen 5-bit codes with odd bit parity of which a selection of 10 would be used, for example, as shown in Table 1. A fault which produced any of the remaining six codes or that converted one of the ten into another would cause an error that the processor could not recognise.

TABLE 1

| Decimal | E | D | C | B | A |
|---|---|---|---|---|---|
| 0 | 1 | 0 | 0 | 0 | 0 |
| 1 | 0 | 0 | 0 | 0 | 1 |
| 2 | 0 | 0 | 0 | 1 | 0 |
| 3 | 1 | 0 | 0 | 1 | 1 |
| 4 | 0 | 0 | 1 | 0 | 0 |
| 5 | 1 | 0 | 1 | 0 | 1 |
| 6 | 1 | 0 | 1 | 1 | 0 |
| 7 | 0 | 0 | 1 | 1 | 1 |
| 8 | 0 | 1 | 0 | 0 | 0 |
| 9 | 1 | 1 | 0 | 0 | 1 |

SUMMARY OF THE INVENTION

An object of the invention is to provide an encoding switch which, while designed for a 5-bit code, is simplified and improves the facility of the processing device to detect errors. This can be achieved by using a 2-out-of-5-bit code instead of the basic odd bit parity code described before. With this configuration there are only ten such 2-out-of-5-bit codes. Thus a fault which converted two "0's" into two "1's" would create an undetectable error in the "odd bit parity system" but would be rejected by the "2-out-of-5 system".

A further known code is a 2-out-of-5 code as shown in Table 2.

TABLE 2

| Decimal | E | D | C | B | A |
|---|---|---|---|---|---|
| 0 | 0 | 0 | 0 | 1 | 1 |
| 1 | 0 | 0 | 1 | 0 | 1 |
| 2 | 0 | 0 | 1 | 1 | 0 |
| 3 | 0 | 1 | 0 | 1 | 0 |
| 4 | 0 | 1 | 1 | 0 | 0 |
| 5 | 1 | 0 | 1 | 0 | 0 |
| 6 | 1 | 1 | 0 | 0 | 0 |
| 7 | 0 | 1 | 0 | 0 | 1 |
| 8 | 1 | 0 | 0 | 0 | 1 |
| 9 | 1 | 0 | 0 | 1 | 0 |

This however, involves the need for integrated circuit buffers required to block feedback paths which occur when switches with codes of more than 1 out of 5 are connected on a single 5-bit input bus of a processing device such as a microprocessor. For example, in the case of two 2-out-of-5 switches that are each set to represent a decimal digit, in the absence of buffers, loops including two pairs of closed contacts in one switch and at least one pair of closed contacts in the other switch would be formed.

According to the invention, there is provided an encoding switch settable at positions representing different decimal digits for providing binary coded outputs representing the decimal digits, the switch comprising conductive elements having first and second parts connected together, said first parts being allocated to provide one 1-out-of-5 code and said second parts being allocated to provide another 1-out-of-5 code, and a rotatable contact means arranged to be set at predetermined positions to select one of said first parts and one of said second parts of a different conductive element whereby two 5-bit words, each word containing one and only one "1" (or "0" for complementary coded switches), can be derived by electronically reading said first and second parts and the required encoded decimal digit derived by combining said two 5-bit words. In use, a processing device checks that it is receiving 1-out-of-5 codes, then combines the two together to re-create the original 2-out-of-5 code.

With one such arrangement for operating in this manner, each said conductive element is divided into two electrically connected parts respectively allocated to two 1-out-of-5 codes, and for each decimal digit, said rotatable contact means is set to select a portion of one contact element allocated to one 1-out-of-5 code and a portion of another element allocated to the other 1-out-of-5 code, whereby two 5-bit words each containing one, and only one, "1" (or "0") can be derived by electronically reading said contact element portions and the required encoded decimal digit derived from combining said two 5-bit words. Preferably the conductive elements each comprise two connected arcuate strips centred on and at different distances from the centre of rotation of the rotatable contact means, with each outer arcuate strip overlapping the inner arcuate strip of the adjacent contact element. The arcuate strips are uniformly distributed about the centre, about which two common rings are also centred. For the selection of each decimal digit, the rotatable contact means bridges a corresponding one of the outer arcuate strips and one common ring, and it also bridges, at a diametrically opposite point, an inner arcuate strip of another conductive element and the other common ring. Such conductive elements together with their connections may be arranged on one side only of a printed circuit board due to the simplicity of this system.

The invention also includes the combination of a plurality of the aforesaid switches with a processing means and electronic scanning means in a numerically controlled mechanism, such as a postal franking meter.

In order that the invention may be clearly understood and readily carried into effect, an encoding switch and apparatus incorporating such switches will now be described.

DESCRIPTION OF PREFERRED EMBODIMENT

Figure 1:
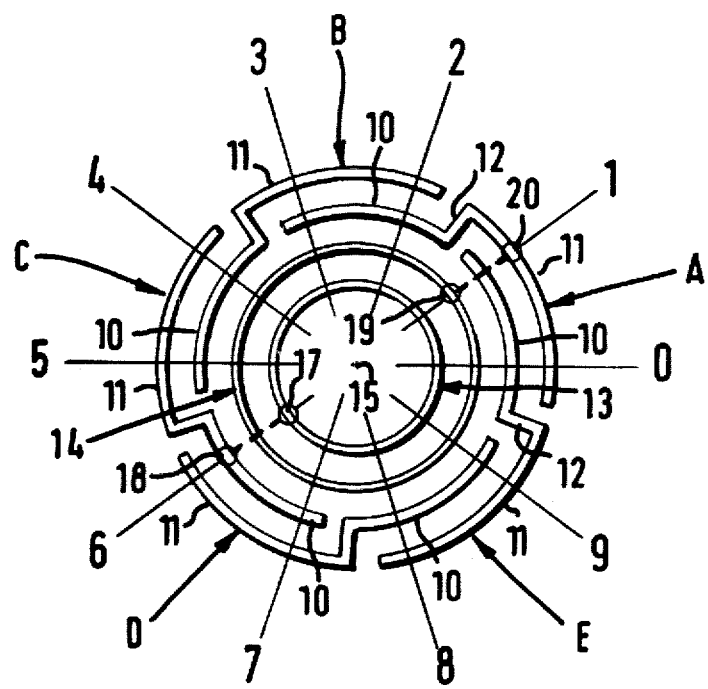
FIG. 1 is a plan view of an encoding switch, shown on an enlarged scale.
Figure 3:
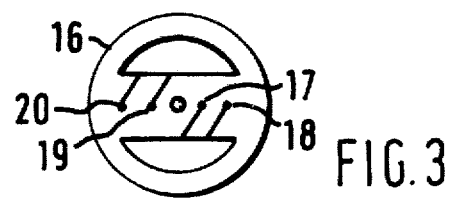
FIG. 3 is a plan view of a rotary part of the switch of FIG. 1.

The switch shown in FIG. 1 comprises five stationary conductive contact strips A, B, C, D, E, each consisting of two arcuate parts 10, 11 joined by a radial portion 12. Each arcuate part, as well as two common conductor rings 13, 14 are centred on a point 15. A rotary part 16 (FIG. 3) of the switch has a pair of bridging contacts 17, 18 that wipe over the ring 13 and inner arcuate portions 10 and a pair of bridging contacts 19, 20 that wipe over the ring 14 and outer arcuate portions 11. As can be seen from FIG. 1 the contacts 17, 18 are diametrically opposite the contacts 19, 20.

The rotary part 16 can be set in any one of ten positions indicated by 0 to 9 in FIG. 1. In FIG. 1 the contacts 19, 20 are shown bridging ring 14 and strip A-11 while contacts 17, 18 bridge ring 13 and strip C-10. It will be seen, therefore, that if a circuit is completed through ring 14 and the contact strips A to E are read through one complete cycle, a 5-bit word 00001 is output in the position shown. Similarly, if a circuit is completed through ring 13 and the contact strips A to E are read through one complete cycle, a 5-bit word 00100 is output. The words can be combined to give 00101 representing decimal 1. This system can be used to represent all decimal digits 0 to 9 as shown in the following table:

TABLE 3

| DECIMAL | COMMON 14 | | | | | COMMON 13 | | | | | COMBINATION | | | | |
|---|---|---|---|---|---|---|---|---|---|---|---|---|---|---|---|
| | E | D | C | B | A | E | D | C | B | A | E | D | C | B | A |
| 0 | 0 | 0 | 0 | 0 | 1 | 0 | 0 | 0 | 1 | 0 | 0 | 0 | 0 | 1 | 1 |
| 1 | 0 | 0 | 0 | 0 | 1 | 0 | 0 | 1 | 0 | 0 | 0 | 0 | 1 | 0 | 1 |
| 2 | 0 | 0 | 0 | 1 | 0 | 0 | 0 | 1 | 0 | 0 | 0 | 0 | 1 | 1 | 0 |
| 3 | 0 | 0 | 0 | 1 | 0 | 0 | 1 | 0 | 0 | 0 | 0 | 1 | 0 | 1 | 0 |
| 4 | 0 | 0 | 1 | 0 | 0 | 0 | 1 | 0 | 0 | 0 | 0 | 1 | 1 | 0 | 0 |
| 5 | 0 | 0 | 1 | 0 | 0 | 1 | 0 | 0 | 0 | 0 | 1 | 0 | 1 | 0 | 0 |
| 6 | 0 | 1 | 0 | 0 | 0 | 1 | 0 | 0 | 0 | 0 | 1 | 1 | 0 | 0 | 0 |
| 7 | 0 | 1 | 0 | 0 | 0 | 0 | 0 | 0 | 0 | 1 | 0 | 1 | 0 | 0 | 1 |
| 8 | 1 | 0 | 0 | 0 | 0 | 0 | 0 | 0 | 0 | 1 | 1 | 0 | 0 | 0 | 1 |
| 9 | 1 | 0 | 0 | 0 | 0 | 0 | 0 | 1 | 0 | 1 | 0 | 0 | 1 | 0 |

Accordingly it is necessary for the outputs to pass to a monitoring means, such as a microprocessor, capable of recognising the coded information from the switch, determining, for security reasons, that there is a single "1" in each word received, and then combining the pairs of words to obtain the required 2-out-of-5 code which in turn is recognised as a decimal number.

Alternatively, it is possible to read the contact strips A to E while the circuits through rings 13, 14 are simultaneously completed, thereby producing the two words to be fed in parallel to the microprocessor or other unit, but in this case 13 to 14 must be electrically isolated by buffers, which may be in the scanner, to avoid feedback paths.

Figure 2:
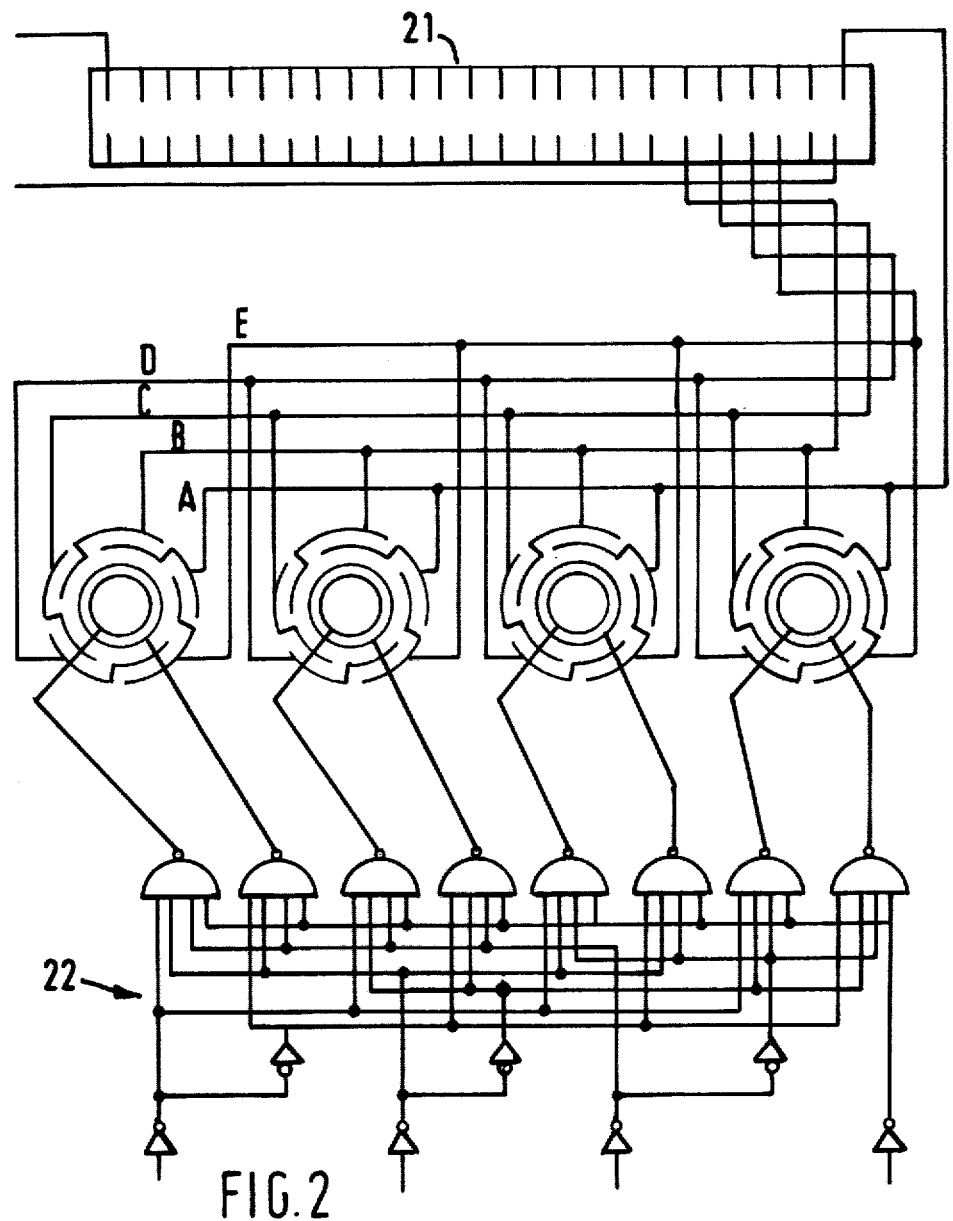
FIG. 2 is a circuit diagram for part of a system employing four encoding switches.

FIG. 2 shows an arrangement in which four switches, each the same as that in FIG. 1, are arranged in a system that may be a postal franking meter. In that event a microprocessor 21 is connected to the switch outputs for processing various functions of the meter in accordance with values that have been set in the switches simultaneously with the setting of print wheels in the meter to print the value to be franked. To enable the coded information to be passed to the microprocessor, the switches are scanned by a unit which may be a BCD-to-decimal decoder/driver 22 comprising four-input NAND gates and inverters arranged as shown. The sequential connection of rings 13 and 14 to earth in turn sequentially produces an earth on an appropriate contact element A to E. The signals on the contact element A to E are recognised by the microprocessor as two 1-out-of-5-bit codes in sequence and are combined to produce a 2-out-of-5-bit code.

It will be appreciated that the system described before is applicable to many other devices that depend on the selection of decimal digits and where security is essential. For example, the invention is applicable to combination locks where the switches have to be set to a decimal code that is recognised by a computer controlling the mechanical release of the lock. In another example, the invention is applied to machine tools for controlling operations where any malfunction would result in serious waste.

We claim:

1. An encoding switch settable at positions representing different decimal digits for providing binary coded outputs representing the decimal digits, the switch comprising five conductive elements having first and second parts connected together, said first parts being allocated to provide one 1-out-of-5 code and said second parts being allocated to provide another 1-out-of-5 code, and a rotatable contact means arranged to be set at predetermined positions to select one of such first parts and one of said second parts of a different conductive element, whereby two 5-bit words, each word containing one and only one "1" (or "0" for complementary coded switches), can be derived by separately electronically reading said first and second parts and the required encoded decimal digit derived by combining said two 5-bit words.

2. An encoding switch according to claim 1, in which said first and second parts comprise arcuate strips centered about and at different distances from the center of rotation of said rotatable contact means, with each first part overlapping the second part of the adjacent contact element, said switch further including two common rings also being centered on said center of rotation, and said rotatable contact means having two bridging elements, one element to bridge said one of said first parts and one common ring, and the other bridging element to bridge said second part of said different contact element and the other common ring.

3. An encoding switch according to claim 2, in which said arcuate strips are uniformly distributed about said center of rotation and said bridging elements are arranged diametrically opposite one another.

4. An encoding switch according to claim 2 or claim 3, in which said conductive elements and all their connections are printed on one side of a printed circuit board.

5. An encoding switch settable at positions representing different decimal digits for providing binary coded output representing the decimal digits, the switch comprising five conductive elements supported on a laminate having first and second parts connected together, said first parts being allocated to provide one 1-out-of-5 code and said second parts being allocated to provide another 1-out-of-5 code, a rotatable contact means mounted for rotation on said laminate about a center of rotation and having two bridging contacts, means for moving said rotatable contact means to predetermined rotational positions such that said bridging contacts are in contact respectively with one of said first parts of one conductive element and one of said second parts of another conductive element, and monitoring means connected to monitor electrical signals in said bridging contacts and to respond to and combine said electrical signals when each of said electrical signals represents a single 1-out-of-5 code and to derive therefrom an encoded decimal digit.

6. An encoding switch according to claim 5, in which said first and second parts are arcuate strips centered about and at different distances from said center of rotation, each first part of each conductive element overlapping the second part of another conductive element.

7. An encoding switch according to claim 6, including two common conductive rings mounted on said laminate of different diameters and centered about said center of rotation, in which said two bridging contacts are arranged respectively to bridge one of said rings and said one of said first parts and the other of said rings and said one of said second parts.

8. A numerically controlled mechanism including an encoding switch according to claim 1.

9. A postal franking numerically controlled mechanism including an encoding switch according to claim 1.

10. A numerically controlled mechanism including an encoding switch according to claim 5.

11. In a numerically controlled mechanism, a plurality of encoding switches according to claim 2, each arranged to be set to represent one of a series of decimal digits, electronic means connected to the rotatable contact means in each switch enabling the conductive elements in each switch to be read electronically, and monitoring means connected to the conductive elements arranged to determine that there is a single "1" in each word received from each switch and to combine the two words received from each switch to represent a selected decimal digit.

12. An encoding switch settable at positions representing different decimal digits for providing binary coded outputs representing the decimal digits, the switch comprising five conductive elements each comprising a first part and a second part electrically connected to the first part, five output leads respectively connected to said conductive elements, the first parts of said conductive elements being arranged sequentially with respect to one another, and the second parts of said conductive elements being arranged sequentially with respect to one another, first and second conductor rails, two input leads respectively connected to said conductor rails, and contact means rotatable about an axis to be set at any one of ten predetermined positions about said axis, in each of said positions said contact means bridges said first conductor rail and selected one of said first parts and simultaneously bridges said second conductor rail and one of said second parts, said one of said second parts being part of one of said conductive elements different from the conductive element which comprises said one of said first parts.

* * * * *